United States Patent
Streefkerk et al.

(10) Patent No.: US 7,808,611 B2
(45) Date of Patent: *Oct. 5, 2010

(54) LITHOGRAPHIC APPARATUS AND DEVICE MANUFACTURING METHOD USING ACIDIC LIQUID

(75) Inventors: Bob Streefkerk, Tilburg (NL); Marcel Mathijs Theodore Marie Dierichs, Venlo (NL); Wendy Fransisca Johanna Gehoel-Van Ansem, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 156 days.

This patent is subject to a terminal disclaimer.

(21) Appl. No.: 11/355,192

(22) Filed: Feb. 16, 2006

(65) Prior Publication Data

US 2007/0046915 A1  Mar. 1, 2007

Related U.S. Application Data

(63) Continuation of application No. 10/852,681, filed on May 25, 2004.

(30) Foreign Application Priority Data

May 30, 2003  (EP) .................................. 03253420

(51) Int. Cl.
*G03B 27/52* (2006.01)
*G03B 27/42* (2006.01)
(52) U.S. Cl. .......................... 355/30; 355/53
(58) Field of Classification Search ............... 355/30, 355/53, 55, 77; 359/380, 886; 205/91, 340; 428/142; 424/401
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,715,039 A | 2/1998 | Fukuda et al. | 355/53 |

(Continued)

FOREIGN PATENT DOCUMENTS

CN  1549303 A  11/2004

(Continued)

OTHER PUBLICATIONS

Casiday et al. Water Hardness Inorganic Reactions Experiment 1998.*

(Continued)

*Primary Examiner*—Peter B Kim
(74) *Attorney, Agent, or Firm*—Pillsbury Winthrop Shaw Pittman LLP (57) ABSTRACT

A lithographic apparatus and device manufacturing method is provided in which exposure is carried out by projecting through a liquid having a pH of less than 7, the liquid being in contact with a substrate to be exposed. The liquid advantageously comprises an anti-reflective topcoat.

78 Claims, 3 Drawing Sheets

U.S. PATENT DOCUMENTS

| | | | |
|---|---|---|---|
| 5,825,043 A | 10/1998 | Suwa | 250/548 |
| 5,888,703 A | 3/1999 | Tomo | 430/315 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,560,032 B2 | 5/2003 | Hatano | 359/656 |
| 6,600,547 B2 | 7/2003 | Watson et al. | 355/30 |
| 6,603,130 B1 | 8/2003 | Bisschops et al. | 250/492.1 |
| 6,633,365 B2 | 10/2003 | Suenaga | 355/53 |
| 6,671,036 B2 | 12/2003 | Kwan | 355/72 |
| 6,788,477 B2 | 9/2004 | Lin | |
| 2002/0020821 A1 | 2/2002 | Van Santen et al. | 250/492 |
| 2002/0060161 A1* | 5/2002 | Roe et al. | 205/340 |
| 2002/0163629 A1 | 11/2002 | Switkes et al. | 355/53 |
| 2003/0123040 A1 | 7/2003 | Almogy | 355/69 |
| 2003/0174408 A1* | 9/2003 | Rostalski et al. | 359/642 |
| 2003/0202993 A1* | 10/2003 | Sato et al. | 424/401 |
| 2003/0211287 A1* | 11/2003 | Pellerite et al. | 428/142 |
| 2004/0000627 A1 | 1/2004 | Schuster | 250/201.2 |
| 2004/0021844 A1 | 2/2004 | Suenaga | 355/67 |
| 2004/0075895 A1 | 4/2004 | Lin | 359/380 |
| 2004/0109237 A1 | 6/2004 | Epple et al. | |
| 2004/0119954 A1 | 6/2004 | Kawashima et al. | 355/30 |
| 2004/0125351 A1 | 7/2004 | Krautschik | 355/53 |
| 2004/0175647 A1 | 9/2004 | French et al. | 430/270.1 |
| 2004/0224525 A1 | 11/2004 | Endo et al. | |
| 2005/0036183 A1 | 2/2005 | Yeo et al. | 359/15 |
| 2005/0037269 A1 | 2/2005 | Levinson | 430/30 |
| 2005/0164522 A1* | 7/2005 | Kunz et al. | 438/780 |
| 2005/0186513 A1 | 8/2005 | Letz et al. | 430/320 |
| 2006/0110676 A1 | 5/2006 | Iwashita et al. | 430/270.1 |
| 2006/0154171 A1 | 7/2006 | Hirayama et al. | 430/270.1 |
| 2006/0154188 A1 | 7/2006 | Hirayama et al. | 430/338 |
| 2007/0247603 A1* | 10/2007 | Hazelton et al. | 355/30 |

FOREIGN PATENT DOCUMENTS

| | | |
|---|---|---|
| CN | 1-272864 C | 8/2006 |
| DE | 206 607 | 2/1984 |
| DE | 221 563 | 4/1985 |
| DE | 224448 | 7/1985 |
| DE | 242880 | 2/1987 |
| EP | 0023231 | 2/1981 |
| EP | 0418427 | 3/1991 |
| EP | 1 026 208 B1 | 8/2000 |
| EP | 1039511 | 9/2000 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| WO | 98/27461 | 6/1998 |
| WO | WO 99/49504 | 9/1999 |
| WO | WO 03/077036 | 9/2003 |
| WO | WO 03/077037 | 9/2003 |
| WO | WO 2004/019128 | 3/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | 2004/079453 | 9/2004 |

OTHER PUBLICATIONS

Cleveland Water What-ifs Water Quality and pH 1998.*
Oh et al. "Refractive Index Change during Exposure for 193 nm Chemically Amplified Resist", SPIE vol. 3678, pp. 643-650, Jun. 1999.*
Gray et al. "Cycle Chemistry pH Measurement" May 12-14, 1998.*
Chen et al. "A Planar Electroosmotic Micropump" Dec. 2002.*
U.S Office Action issued for U.S. Appl. No. 10/803,712, dated May 2, 2007.
M. Switkes et al., "Immersion Lithography at 157 nm", MIT Lincoln Lab, Orlando 2001-1, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future FAB International, vol. 15, Jul. 11, 2003.
H. Kawata et al., "Fabrication of 0.2μm Fine Patterns Using Optical Projection Lithography with an Oil Immersion Lens", Jpn. J. Appl. Phys. vol. 31 (1992), pp. 4174-4177.
G. Owen et al., "⅛μm Optical Lithography", J. Vac. Sci. Technol. B., vol. 10, No. 6, Nov./Dec. 1992, pp. 3032-3036.
H. Hogan, "New Semiconductor Lithography Makes a Splash", Photonics Spectra, Photonics TechnologyWorld, Oct. 2003 Edition, pp. 1-3.
S. Owa and N. Nagasaka, "Potential Performance and Feasibility of Immersion Lithography", NGL Workshop 2003, Jul. 10, 2003, Slide Nos. 1-33.
S. Owa et al., "Update on 193nm immersion exposure tool", Litho Forum, International SEMATECH, Los Angeles, Jan. 27-29, 2004, Slide Nos. 1-51.
H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, "The $\kappa_3$ coefficient in nonparaxial $\Lambda$/NA scaling equations for resolution, depth of focus, and immersion lithography," *J. Microlith., Microfab., Microsyst.* 1(1):7-12 (2002).

Chinese Office Action for Chinese Application No. 200410047827.4 dated May 8, 2009.

\* cited by examiner

Fig. 4

LITHOGRAPHIC APPARATUS AND DEVICE MANUFACTURING METHOD USING ACIDIC LIQUID

This application is a continuation of co-pending U.S. patent application Ser. No. 10/852,681, filed May 25, 2004, which claims priority of European patent application no. EP 03253420.8 filed May 30, 2003, the contents of each of the foregoing applications incorporated herein in their entirety.

FIELD

The present invention relates to a lithographic projection apparatus and device manufacturing method.

BACKGROUND

The term "patterning device" as here employed should be broadly interpreted as referring to any device that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such a patterning device include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuator. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The matrix addressing can be performed using suitable electronics. In both of the situations described hereabove, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as needed;

A programmable LCD array. An example of such a construction is given in U.S. Pat. No. 5,229,872, which is incorporated herein by reference. As above, the support structure in this case may be embodied as a frame or table, for example, which may be fixed or movable as needed.

For purposes of simplicity, the rest of this text may, at certain locations, specifically direct itself to examples involving a mask and mask table; however, the general principles discussed in such instances should be seen in the broader context of the patterning devices as hereinabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at one time; such an apparatus is commonly referred to as a stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are needed, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "projection lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation. Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposure. Dual stage lithographic apparatus are described, for example, in U.S. Pat. No. 5,969,441 and PCT patent application publication WO 98/40791, incorporated herein by reference.

In order to reduce the size of features that can be imaged on a substrate, it has previously been proposed that the substrate be immersed in a liquid having a relatively high refractive index, e.g. water. The immersion liquid typically fills a space between the final element of the projection system and the substrate, such that the exposure radiation in this region will have a shorter wavelength. (The effect of the liquid may also be regarded as increasing the effective NA of the system).

However, submersing the substrate or substrate and substrate table in a bath of liquid (see for example U.S. Pat. No. 4,509,852, hereby incorporated in its entirety by reference) means that there is a large body of liquid to be accelerated during a scanning exposure. This requires additional or more powerful motors and turbulence in the liquid may lead to undesirable and unpredictable effects.

Figure 3:
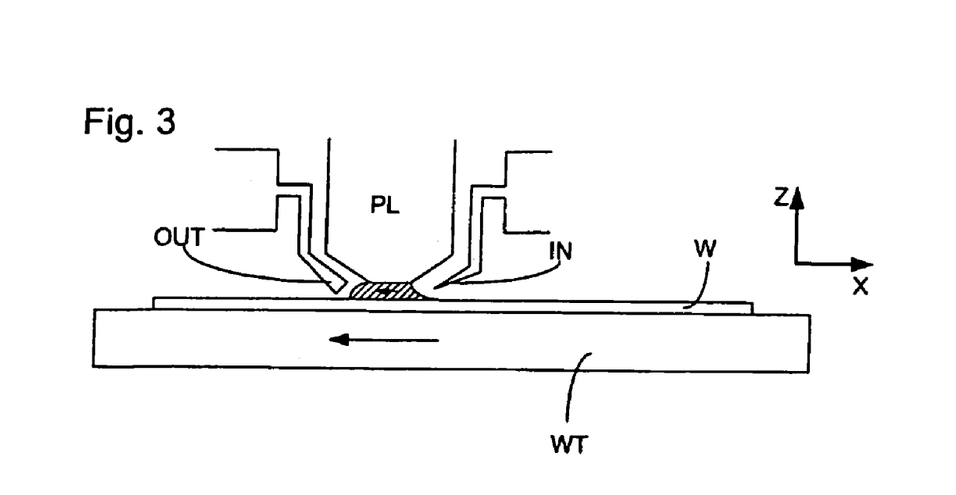
FIG. 3 depicts an alternative liquid supply system.
Figure 4:
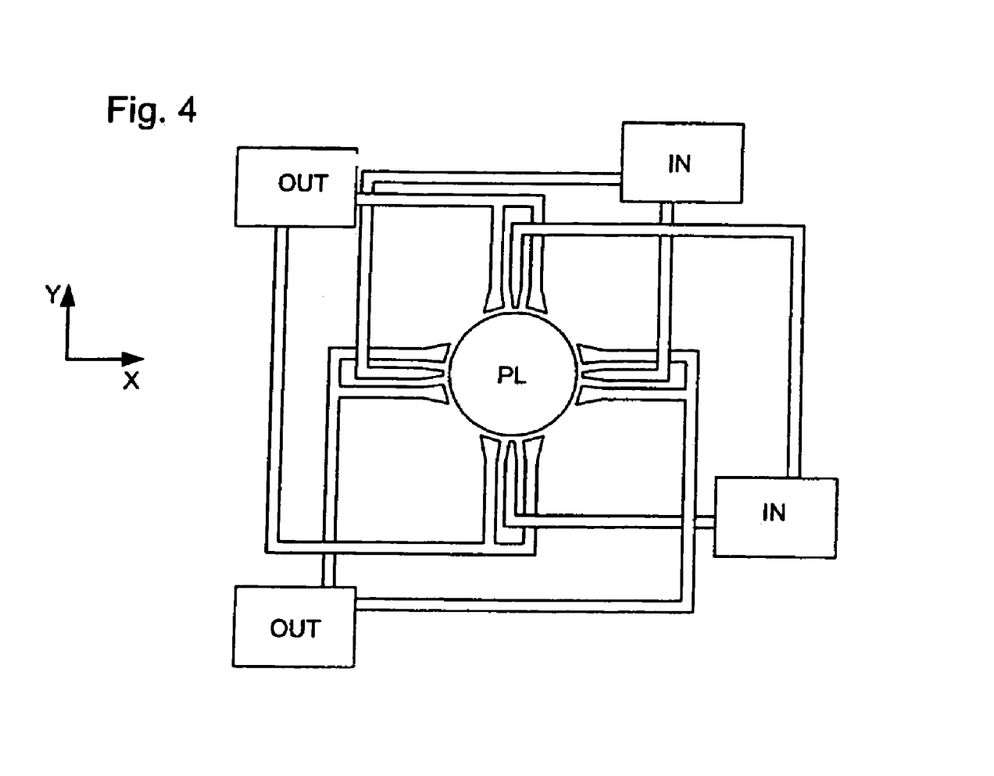
FIG. 4 depicts an example of the orientations of inlets and outlets of the liquid supply system of FIG. 3.

One of the solutions proposed is for a liquid supply system to provide liquid in a localized area between the final element of the projection system and the substrate (the substrate generally has a larger surface area than the final element of the projection system). One way which has been proposed to arrange for this is disclosed in PCT patent application publication WO 99/49504, hereby incorporated in its entirety by reference. As illustrated in FIGS. 3 and 4, liquid is supplied by at least one outlet OUT onto the substrate, preferably along the direction of movement of the final element relative to the substrate, and is removed by at least one inlet IN after having passed under the projection system. That is, as the substrate is scanned beneath the element in a −X direction, liquid is supplied at the +X side of the element and taken up at the −X side. FIG. 3 shows the arrangement schematically in which liquid is supplied via outlet OUT and is taken up on the other side of the element by inlet IN which is connected to a low pressure source. In the illustration of FIG. 3 the liquid is supplied along the direction of movement of the final element relative to the substrate, though this does not need to be the case. Various orientations and numbers of in- and out-lets positioned around the final element are possible, one example is illustrated in FIG. 4 in which four sets of an inlet with an outlet on either side are provided in a regular pattern around the final element.

SUMMARY

In all of these systems, however, the immersion of all or part of a surface of the substrate during exposure may lead to dissolution of the chemically amplified resist which is typically used on a surface of the substrate. This may cause degradation in an upper layer of the resist. Furthermore, the uneven nature of the resist after degradation may bring about the occurrence of T-topping during development. The developer is able to dissolve the underneath areas of the resist that have not been degraded during immersion, but the degraded areas at the surface cannot be developed uniformly. This may lead to the formation of an undesirable mushroom shape in the developed area.

Accordingly, it may be advantageous, for example, to provide a lithographic projection apparatus in which exposure takes place while at least part of a substrate surface is immersed, but which reduces or avoids degradation of the resist present on that part of the substrate surface.

According to an embodiment of the invention, there is provided a lithographic projection apparatus comprising:

an illuminator arranged to condition a beam of radiation;

a support structure configured to hold a patterning device, the patterning device capable of imparting a pattern to the beam;

a substrate table configured to hold a substrate;

a projection system arranged to project the patterned beam onto a target portion of the substrate; and a liquid supply system configured to provide a liquid to a space between the projection system and the substrate, the liquid being an aqueous solution having a pH of less than 7.

The acidic nature of the liquid may significantly reduce the degradation effects which are a problem with prior art immersion lithography systems. This is because the photo-acids that are produced as a result of exposure, are significantly less soluble in acidic aqueous solutions than they are in water or other neutral species. The immersion liquid, according to an embodiment, therefore may decrease dissolution of the surface layers of the resist. T-topping may also be reduced.

The liquid, according to an embodiment, comprises topcoat, for example anti-reflective topcoat. Anti-reflective topcoat is acidic and therefore its addition to the immersion liquid can generate the desired low pH. The use of topcoat also has an advantage that when the substrate is withdrawn from a position where a part of the substrate surface is immersed in the immersion liquid, a thin film of topcoat remains on the substrate surface. The presence of the topcoat protects the substrate surface from further degradation by chemicals in the environment. In particular, reaction with amines is substantially prevented, thereby further reducing T-topping. Thus, the use of an anti-reflective topcoat solution in the liquid may obviate removing amines from the atmosphere in which the exposed substrate is placed. Charcoal filters, for example, may no longer be necessary.

In an embodiment, the liquid supply system comprises a liquid removal device configured to remove the liquid from a surface of the substrate and to leave on the surface of the substrate a film of the liquid. In an embodiment, the film has a thickness in the order of 1 μm or less. A film may assist in preventing or reducing contamination of the exposed substrate by providing a barrier, in the form of the film of liquid, between the sensitive substrate surface and the atmosphere. Particular advantages are obtained when the liquid contains topcoat as mentioned above.

According to a further aspect, there is provided a device manufacturing method comprising projecting a patterned beam of radiation, through a liquid comprising an aqueous solution having a pH of less than 7, onto a target portion of a substrate.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm), as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION

Figure 1:
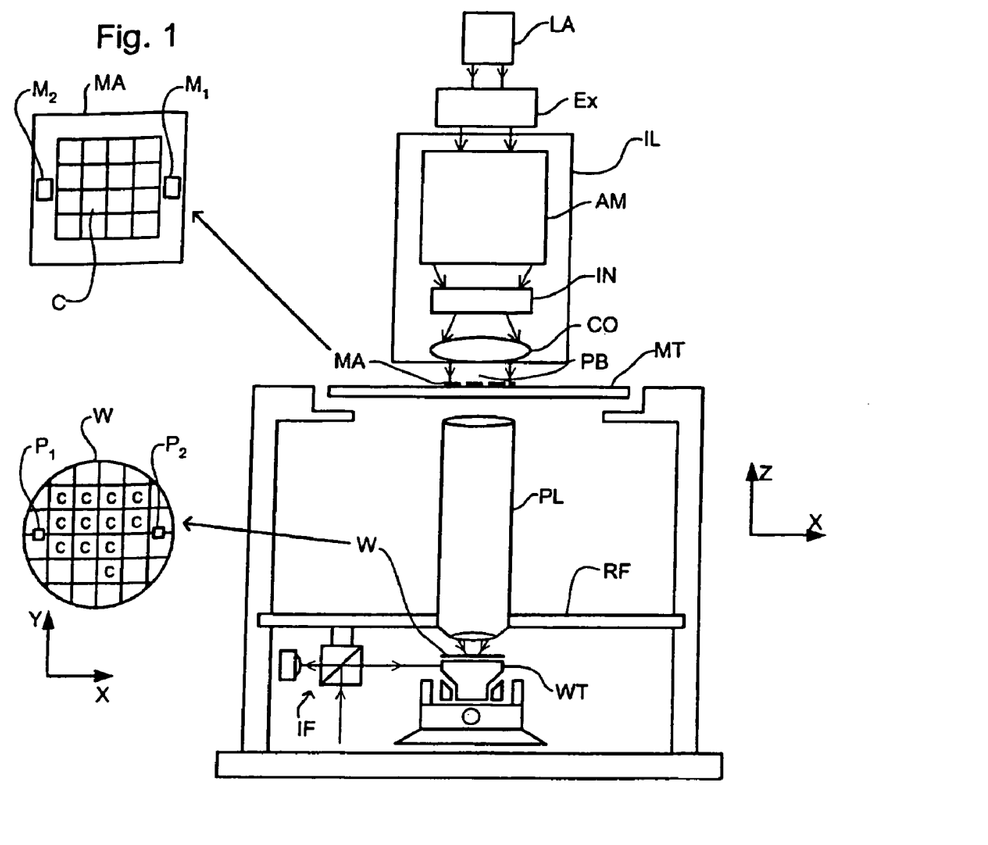
FIG. 1 depicts a lithographic projection apparatus according to an embodiment of the invention.

FIG. 1 schematically depicts a lithographic projection apparatus according to a particular embodiment of the invention. The apparatus comprises a radiation system Ex, IL, for supplying a projection beam PB of radiation (e.g. DUV radiation), which in this particular case also comprises a radiation source LA; a first object table (mask table) MT provided with a mask holder for holding a patterning device, illustrated in the form of the mask MA (e.g. a reticle), and connected to a first positioner for accurately positioning the mask with respect to item PL; a second object table (substrate table) WT provided with a substrate holder for holding a substrate W (e.g. a resist-coated silicon wafer), and connected to a second positioner for accurately positioning the substrate with respect to item PL; a projection system PL (e.g. a refractive lens system) for imaging an irradiated portion of the mask MA onto a target portion C (e.g. comprising one or more dies) of the substrate W.

As here depicted, the apparatus is of a transmissive type (e.g. has a transmissive mask). However, in general, it may also be of a reflective type, for example (e.g. with a reflective mask). Alternatively, the apparatus may employ another kind of patterning device, such as a programmable mirror array of a type as referred to above.

The source LA (e.g. an excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass at least both of these scenarios.

The beam PB subsequently intercepts the mask MA, which is held on a mask table MT. Having traversed by the mask MA, the beam PB passes through the projection system PL, which focuses the beam PB onto a target portion C of the substrate W. With the aid of the second positioner (and interferometric measuring device IF), the substrate table WT can be moved accurately, e.g. so as to position different target portions C in the path of the beam PB. Similarly, the first positioner can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1.

However, in the case of a stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected at one time (i.e. a single "flash") onto a target portion C. The substrate table WT is then shifted in the X and/or Y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WT is simultaneously moved in the same or opposite direction at a speed $V=Mv$, in which M is the magnification of the projection system PL (typically, $M=¼$ or $⅕$). In this manner, a relatively large target portion C can be exposed, without having to compromise on resolution.

Another immersion lithography is to provide the liquid supply system with a seal member which extends along at least a part of a boundary of the space between the final element of the projection system and the substrate table. The seal member is substantially stationary relative to the projection system in the XY plane and a seal is formed between the seal member and the surface of the substrate. In an implementation, the seal is a contactless seal such as a gas seal.

Figure 2:
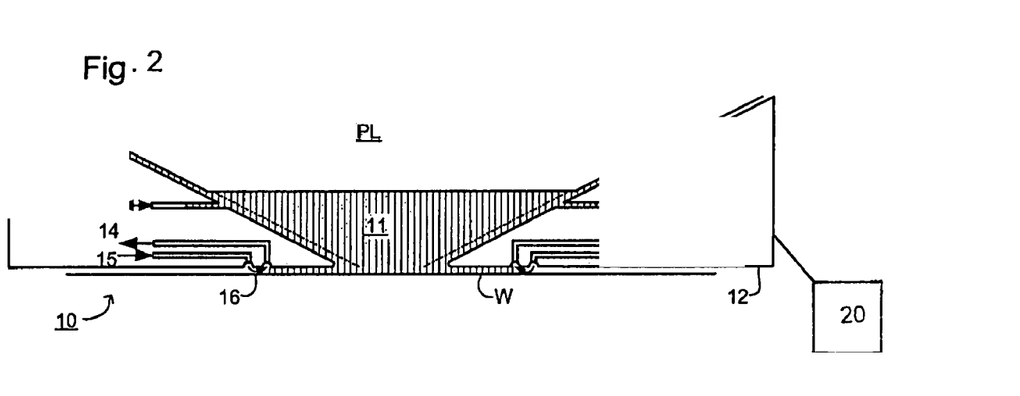
FIG. 2 depicts a liquid supply system according to an embodiment of the invention.

FIG. 2 depicts a liquid reservoir 10 between the projection system and the substrate stage according to an embodiment of the invention. The liquid reservoir 10 comprises a liquid 11 having a relatively high refractive index, provided via inlet/outlet ducts 13. A liquid source containing the liquid is typically provided which is used to fill the reservoir via inlet ducts 13. The liquid has the effect that the radiation of the projection beam has a shorter wavelength in the liquid than in air or a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field.

FIGS. 3 and 4 depict the liquid supply system of an alternative embodiment of the invention. The details of this system have been discussed further above.

The liquid used in an embodiment of the present invention is an aqueous solution having a pH of less than 7, i.e. the liquid is acidic. A suitable pH is 6.5 or less, for example 6 or less, 5 or less or even 4 or less. In an embodiment, homogeneous liquids are used to ensure that the acidity is present throughout the liquid and therefore that the entire applicable surface of the substrate is in contact with acidic solution. The liquid should also be stable when irradiated at the wavelength used for the projection beam. Typically, the liquid should be stable when irradiated at one or more commonly used wavelengths, for example 193 nm and 248 nm.

The addition of a solute can affect the transmissivity and refractive index of the liquid. The concentration of the solute should therefore be kept to a suitable level, to ensure that transmissivity at the wavelength used for the projection beam is maximized and so that a minimum effect is seen on the refractive index. In an embodiment, the liquid has a high transmissivity at one or more commonly used wavelengths, for example 193 nm and 248 nm. Further, the concentration of solute is, in an embodiment, such that the refractive index of the liquid is not altered substantially. The solute concentration may vary depending on the solute used. However, examples of suitable solutions have a water content of at least 90 wt %, for example at least 95 wt % or at least 99 wt %.

In an embodiment of the invention, the liquid is an aqueous topcoat solution, for example an anti-reflective topcoat solution. Anti-reflective topcoats are well known in the art and are available commercially. Examples include the anti-reflective topcoat solutions AZ AQUATAR and JSR NFC540 which can be obtained from Clariant (Japan) K.K. and JSR respectively. These topcoat solutions typically comprise greater than 90 wt % water. However, in order to improve transmissivity, the solutions are typically further diluted. For example, the solution AZ AQUATAR-6 may be diluted in a ratio of about 1:10 (topcoat solution: water).

An example of an active ingredient of an anti-reflective topcoat solution is a fluoroalkylsulfonic acid. Suitable liquids for use as the immersion liquid according to an embodiment of the present invention include aqueous solutions comprising one or more fluoroalkylsulfonic acids optionally together with or substituted by one or more fluoroalkylsulfonic acid salts.

The acidic nature of anti-reflective topcoats provides the liquid with the desired acidity and thus reduces degradation of the resist. An anti-reflective topcoat solution, or a fluoroalkylsulfonic acid is therefore useful as an acidity regulator in a liquid for use in an embodiment of the method of the present invention.

A liquid supply system for use in an embodiment of the present invention is that depicted in FIG. 2. The reservoir 10 forms a contactless seal to the substrate around the image field of the projection system so that liquid is confined to a space between the substrate surface and the final element of the projection system. The reservoir is formed by a seal member 12 positioned below and surrounding the final element of the projection system PL. Liquid is brought into the space below the projection system and within the seal member 12. The seal member 12 extends a little above the final element of the projection system and the liquid level rises above the final element so that a buffer of liquid is provided. The seal member 12 has an inner periphery that at the upper end closely conforms to the step of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the seal member 12 and the surface of the substrate W. The gas seal is formed by gas, e.g. air or synthetic air or $N_2$ or another inert gas, provided under pressure via inlet 15 to the gap between seal member 12 and substrate and extracted via outlet 14. The overpressure on the gas inlet 15, vacuum level on the outlet 14 and geometry of the gap are arranged so that there is a high-velocity gas flow inwards that confines the liquid.

The gas outlet system can also be used to remove the liquid from the system, thus acting as a liquid removal device. This is achieved by reducing the gas inlet pressure and allowing the liquid to be sucked out by the vacuum system, which can easily be arranged to handle the liquid, as well as the gas used to form the seal. In this way, the gas outlet system can be used to remove excess liquid from the substrate surface after exposure. The substrate W is taken out of the system and, as the substrate passes gas outlet 14, liquid is removed by the vacuum system. Advantageously, the gas outlet system is configured to leave on the surface of the substrate a film of liquid. This film should be thin, for example in the order of 1 μm or less, or 60 nm or less. A controller 20 is, in an embodiment, provided to control the thickness of the film left on the substrate surface, for example by controlling the vacuum applied at gas outlet 14.

Another embodiment of the invention employs the liquid supply system depicted in FIGS. 3 and 4. In this embodiment, at least one inlet IN typically acts as the liquid removal device. Thus, as the substrate is extracted from the system, at least one inlet IN takes up any excess liquid remaining on the substrate surface. If desired, the inlet(s) may be adapted to leave a film of liquid on the surface of the substrate. This film should be thin, for example in the order of 1 μm or less, or 60 nm or less. A controller may be provided to control the thickness of the film left on the substrate surface, for example by controlling a vacuum or low pressure source connected to the inlet(s) IN.

While a film of liquid is desirably left on the surface of the substrate, it is not necessary to leave liquid on the surface of an alignment mark or system when exposure is, or has been, carried out. Thus, the controller provided to control the thickness of the film can be configured as necessary (for example by increasing the vacuum) to remove all liquid from the surface of the alignment mark or system after exposure.

While specific embodiments of the invention have been described above, it will be appreciated that the invention may be practiced otherwise than as described. The description is not intended to limit the invention.

The invention claimed is:

1. An immersion lithographic system comprising:
   an optical surface;
   a wafer support for holding a workpiece; and
   a liquid supply system configured to supply an aqueous immersion fluid with a pH less than 7 between the optical surface and the wafer support, said immersion fluid contacting at least a portion of the optical surface, wherein the fluid has the pH less than 7 in the immersion lithographic system prior to exit from an outlet to between the optical surface and the wafer support to contact with the optical surface.

2. The system of claim 1 wherein the pH of said immersion fluid is greater than or equal to 4 but less than or equal to 7.

3. The system of claim 2 wherein the pH of said immersion fluid is selected from the range of 4 to 6.5.

4. The system of claim 3 wherein the pH of said immersion fluid is greater than or equal to 5 but less than or equal to 7.

5. The system of claim 4 wherein the pH of said immersion fluid is greater than or equal to 6 but less than or equal to 7.

6. The system of claim 1 further comprising a semiconductor structure on the wafer support, said semiconductor structure having a topmost photosensitive layer.

7. The system of claim 6 wherein the photosensitive layer comprises a chemically amplified photoresist.

8. The system of claim 6 wherein the immersion fluid is in contact with a portion of the photosensitive layer.

9. The system of claim 6 wherein the semiconductor structure is immersed in the immersion fluid.

10. The system of claim 6 wherein the wafer support is immersed in the immersion fluid.

11. An immersion lithographic system for projecting light having a wavelength of less than 197 nm, the system comprising:
an optical surface;
a liquid supply system configured to supply water with a pH less than 7, said water contacting at least a portion of the optical surface, wherein the water has the pH less than 7 in the immersion lithographic system prior to exit from an outlet to contact with the optical surface; and
a semiconductor structure having a topmost photoresist layer, a portion of said photoresist being in contact with the water.

12. The system of claim 11 wherein the pH of the water is selected from the range of 4 to 6.5.

13. The system of claim 12 wherein the pH of the water is greater than or equal to 5 but less than or equal to 7.

14. The system of claim 13 wherein the pH of the water is greater than or equal to 6 but less than or equal to 7.

15. The system of claim 11 further comprising a fluorine containing compound dissolved in the water.

16. The system of claim 11 wherein the photoresist layer comprises a chemically amplified photoresist.

17. The system of claim 11 wherein the semiconductor structure is immersed in the water.

18. The system of claim 11 further comprising a wafer support underlying the semiconductor structure.

19. The system of claim 18 wherein the wafer support is immersed in the water.

20. A method for illuminating a semiconductor structure having a topmost photoresist layer, comprising the steps of:
introducing an aqueous immersion fluid into a space between an optical surface and the photoresist layer, said immersion fluid having a pH of less than 7 just prior to exit from an outlet to the space to contact with the optical surface and/or the photoresist layer; and
directing optical energy through the immersion fluid and onto said photoresist layer.

21. The method of claim 20 wherein the pH of the immersion fluid is greater than or equal to 4 but less than or equal to 7.

22. The method of claim 21 wherein the pH of the immersion fluid is selected from the range of 4 to 6.5.

23. The method of claim 22 wherein the pH of the immersion fluid is greater than or equal to 5 but less than or equal to 7.

24. The method of claim 23 wherein the pH of the immersion fluid is greater than or equal to 6 but less than or equal to 7.

25. The method of claim 20 further comprising a fluorine containing compound dissolved in the immersion fluid.

26. The method of claim 20 wherein the photoresist layer comprises a chemically amplified photoresist.

27. The method of claim 20 wherein the immersion fluid is in contact with a portion of the photoresist layer.

28. The method of claim 20 wherein the semiconductor structure is immersed in the immersion fluid.

29. The method of claim 20 further comprising a wafer support underlying the semiconductor structure.

30. The method of claim 29 wherein the wafer support is immersed in the immersion fluid.

31. The method of claim 20 further comprising a step of developing the photoresist layer.

32. A method for illuminating a semiconductor structure having a topmost photoresist layer, comprising the steps of:
introducing water into a space between an optical surface and the photoresist layer said water having a pH of less than 7 just prior to exit from an outlet to contact with the optical surface and/or the photoresist layer; and
directing light with a wavelength of less than 450 nm through the water and onto said photoresist.

33. The method of claim 32 wherein the pH of the water is greater than or equal to 4 but less than or equal to 7.

34. The method of claim 33 wherein the pH of the water is greater than or equal to 5 but less than or equal to 7.

35. The method of claim 34 wherein the pH of the water is greater than or equal to 6 but less than or equal to 7.

36. The method of claim 32 further comprising a fluorine containing compound dissolved in the water.

37. The method of claim 32 wherein the photoresist layer comprises a chemically amplified photoresist.

38. The method of claim 32 wherein the semiconductor structure is immersed in the water.

39. The method of claim 32 further comprising a wafer support underlying the semiconductor structure.

40. The method of claim 39 wherein the wafer support is immersed in the water.

41. A lithographic projection apparatus, comprising:
a substrate table configured to hold a substrate;
a projection system arranged to project a patterned beam of radiation having a wavelength of about 248 nm or less onto a target portion of the substrate; and
a liquid supply system configured to provide an aqueous liquid to a space between the projection system and the substrate, the liquid having an acid fluid added thereto prior to exit from an outlet to contact of the liquid with the projection system and/or the substrate so as to have a pH of about 6.5 or less.

42. The apparatus of claim 41, wherein the liquid comprises at least 90 wt % water.

43. The apparatus of claim 41, wherein the liquid comprises at least 99 wt % water.

44. The apparatus of claim 41, wherein the liquid has a pH of 6 or less.

45. The apparatus of claim 41, wherein the liquid has a pH of 6 or less and comprises at least 99 wt % water and the patterned beam of radiation has a wavelength of about 193 nm.

46. The apparatus of claim 41, wherein the liquid comprises an anti-reflective topcoat solution.

47. The apparatus of claim 41, wherein the liquid supply system comprises a liquid removal device configured to remove the liquid from a surface of the substrate and to leave on the surface of the substrate a film of the liquid.

48. The apparatus of claim 47, further comprising a controller configured to control the thickness of the film which remains on the substrate after liquid removal.

49. The apparatus of claim 47, further comprising a controller configured to control removal of substantially all liquid from at least a portion of a surface of the substrate, the substrate table, or both.

50. The apparatus of claim 41, wherein the space, through which the patterned beam is to be projected, has a cross-sectional area less than or equal to the area of the substrate and the liquid supply system comprises an outlet to supply a liquid to the space and an inlet configured to remove liquid after the liquid has passed under the projection system.

51. The apparatus of claim 50, wherein the liquid supply system comprises a liquid confinement structure extending along at least a part of a boundary of the space, the liquid confinement structure positioned adjacent a final surface of the projection system and comprising the inlet and outlet.

52. The apparatus of claim 50, further comprising another outlet located radially outward, with respect to an optical axis of the projection system, of the space to supply gas to at least partly confine liquid in the space.

53. A lithographic exposure method, comprising:
combining an acidic fluid with water to form an aqueous solution having a pH of less than 7 prior to exit from an outlet to contact with a substrate; and
projecting a patterned beam of radiation having a wavelength of about 248 nm or less through the aqueous solution onto a target portion of photoresist of the substrate.

54. The method of claim 53, further comprising supplying the aqueous solution to a space between a projection system used to project the patterned beam and the substrate.

55. The method of claim 53, wherein the aqueous solution has a pH of about 6.5 or less.

56. The method of claim 53, wherein the aqueous solution has a pH of about 6 or less.

57. The method of claim 53, wherein the aqueous solution comprises at least 99 wt % water.

58. The method of claim 53, wherein:
the aqueous solution has a pH of 6.5 or less;
the aqueous solution comprises at least 99 wt % water; and
the patterned beam of radiation has a wavelength of about 193 nm.

59. The method of claim 53, wherein the photoresist comprises a layer of chemically amplified resist and wherein the aqueous solution is in contact with at least part of the layer.

60. The method of claim 53, wherein the space, through which the patterned beam is to be projected, has a cross-sectional area less than or equal to the area of the substrate and further comprising supplying the aqueous solution to the space and removing aqueous solution after the aqueous solution has passed under the projection system.

61. The method of claim 60, further comprising at least partly confining the aqueous solution in the space using a liquid confinement structure extending along at least a part of a boundary of the space, the liquid confinement structure positioned adjacent a final surface of the projection system and configured to supply and remove aqueous solution.

62. The method of claim 60, further comprising supplying gas to a position located radially outward, with respect to an optical axis of the projection system, of the space so as to at least partly confine aqueous solution in the space.

63. The method of claim 53, wherein the aqueous solution has a refractive index substantially equal to the refractive index of water.

64. The method of claim 53, wherein the acidic fluid comprises an anti-reflective topcoat solution.

65. A lithographic exposure method, comprising:
supplying an aqueous liquid having a pH of about 6.5 or less to a space between a projection system and a substrate table, wherein the liquid has the pH of about 6.5 or less just prior to exit from an outlet and introduction into an optical path traversing the space; and
projecting a patterned beam of radiation having a wavelength of about 248 nm or less, through the liquid onto a target portion of photoresist of a substrate.

66. The method of claim 65, wherein the liquid comprises at least 90 wt % water.

67. The method of claim 66, wherein the liquid comprises at least 99 wt % water.

68. The method of claim 65, wherein the liquid has a pH of about 6 or less.

69. The method of claim 65, wherein the liquid comprises an anti-reflective topcoat solution.

70. The method of claim 65, comprising removing the liquid from a surface of the substrate and leaving on the surface of the substrate a film of the liquid.

71. The method of claim 70, comprising controlling the thickness of the film which remains on the substrate after liquid removal.

72. The method of claim 65, wherein the space, through which the patterned beam is to be projected, has a cross-sectional area less than or equal to the area of the substrate and further comprising supplying the liquid to the space and removing liquid after the liquid has passed under the projection system.

73. The method of claim 72, further comprising at least partly confining the liquid in the space using a liquid confinement structure extending along at least a part of a boundary of the space, the liquid confinement structure positioned adjacent a final surface of the projection system and configured to supply and remove liquid.

74. The method of claim 72, further comprising supplying gas to a position located radially outward, with respect to an optical axis of the projection system, of the space so as to at least partly confine liquid in the space.

75. A lithographic projection apparatus, comprising:
a substrate table configured to hold a substrate;
a projection system arranged to project a patterned beam of radiation having a wavelength of about 248 nm or less onto a target portion of the substrate; and
a liquid supply system configured to provide an aqueous liquid having a pH of about 6 or less to a space between the projection system and the substrate, the space through which the patterned beam is to be projected having a cross-sectional area less than or equal to the area of the substrate and the liquid has the pH of about 6 or less in the lithographic projection apparatus prior to exit from an outlet and introduction into an optical path traversing the space, and the liquid supply system comprising an outlet to supply the liquid to the space and to be in contact with a surface of the substrate and an inlet configured to remove liquid from the space after the liquid has passed under the projection system.

76. The apparatus of claim 75, wherein the liquid supply system comprises a liquid confinement structure extending along at least a part of a boundary of the space, the liquid confinement structure positioned adjacent a final surface of the projection system and comprising the inlet and outlet.

77. The apparatus of claim 75, further comprising another outlet located radially outward, with respect to an optical axis of the projection system, of the space to supply gas to at least partly confine liquid in the space.

78. The apparatus of claim 75, wherein the liquid comprises at least 99 wt % water and has an acid fluid added thereto so as to have the pH of about 6 or less.

* * * * *

UNITED STATES PATENT AND TRADEMARK OFFICE
CERTIFICATE OF CORRECTION

PATENT NO. : 7,808,611 B2  Page 1 of 1
APPLICATION NO. : 11/355192
DATED : October 5, 2010
INVENTOR(S) : Streefkerk et al.

It is certified that error appears in the above-identified patent and that said Letters Patent is hereby corrected as shown below:

In the drawings:
Sheet 2 of 3 of the Figures, specifically, Fig. 2, is replaced with the following Fig. 2, and as shown on the attached Replacement Sheet:

Signed and Sealed this

Thirtieth Day of November, 2010

David J. Kappos
*Director of the United States Patent and Trademark Office*